(12) United States Patent
Vashchenko

(10) Patent No.: US 7,915,678 B1
(45) Date of Patent: *Mar. 29, 2011

(54) SNAPBACK CAPABLE NLDMOS, DMOS AND EXTENDED VOLTAGE NMOS DEVICES

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 63 days.

This patent is subject to a terminal disclaimer.

(21) Appl. No.: 11/155,081

(22) Filed: Jun. 17, 2005

(51) Int. Cl.
*H01L 29/72* (2006.01)

(52) U.S. Cl. ........ 257/341; 257/122; 257/133; 257/137; 257/328; 257/355; 361/56

(58) Field of Classification Search ............... 257/122, 257/133, 137, 328, 341, 355; 361/56
See application file for complete search history.

(56) References Cited

U.S. PATENT DOCUMENTS 6,911,679 B1 * 6/2005 Vashchenko et al. ......... 257/122
2004/0027745 A1 * 2/2004 Kunz et al. ..................... 361/56

* cited by examiner

*Primary Examiner* — Edward Wojciechowicz
(74) *Attorney, Agent, or Firm* — Jurgen K. Vollrath; Vollrath & Associates

(57) ABSTRACT

In an NLDMOS, DMOS and NMOS device, the ability is provided for withstanding snapback conditions by providing one or more p+ emitter regions interdigitated between drain regions having drain contacts and electrically connecting the drain contacts to contacts of the emitter regions.

9 Claims, 4 Drawing Sheets

SNAPBACK CAPABLE NLDMOS, DMOS AND EXTENDED VOLTAGE NMOS DEVICES

FIELD OF THE INVENTION

The present invention deals with high voltage devices that can withstand ESD events. In particular, it deals with high voltage devices that can reversibly withstand snapback mode.

BACKGROUND OF THE INVENTION

Numerous devices have been developed for handling electrostatic discharge (ESD) events. These ESD protection devices may be categorized as falling into two groups: the active devices that work in normal operating mode, and the snapback devices which are designed to be triggered and operate in snapback mode during an ESD event and then turn off again as voltage drops below the holding voltage of the device.

NLDMOS and DMOS devices are intended to be used in normal mode and will be destroyed if they go into snapback. Even high voltage NLDMOS and DMOS devices will only survive if the voltage they are handling does not exceed the capabilities of the device. While these devices typically are meant not to go into snapback, local overstresses due to current crowding can cause these devices to go into snapback, thereby damaging the device. Thus, in the case of an ESD event, unless the device is made extremely large, the device is pushed past its capabilities and goes into snapback, causing irreversible breakdown. Typically the margin is rather small before the devices go into snapback. This problem is exacerbated by the fact that the snapback voltage is dependent on gate bias and in practice high-voltage devices used for voltage regulation to provide a low voltage to internal circuits are often not directly connected to the power pad and ground. Thus they fail to provide local clamping of the high voltage pad and ground.

A typical NLDMOS, more correctly referred to as a drain extended MOS (DeMOS) is shown in cross-section in FIG. 1, which includes an n-epitaxial layer 100 in which an n-well 102 is formed. In the case of a BiCMOS process an n-buried layer (NBL) 103 may also be formed in the n-epi 100. An n+ drain 104 is formed in the n-well 102, and an n+ source 106 is formed in a p-well 108 in the n-epi 100. A polysilicon gate 110 is formed on top of the n– and p-wells 102, 108, the extended portion of the gate 110 being isolated from the n-well 102 by an isolation oxide 112. As shown in FIG. 1, the drain 104 includes a drain contact 114, the source 106 includes a source contact 116, and the gate 110 includes a gate contact 120.

FIG. 2 shows another prior art device in cross-section, namely an NLDMOS-SCR, which is capable of operating in snapback mode but suffers from considerable on-state resistance losses during normal mode. This device includes an n-epitaxial layer 200 grown on a p-substrate 201. An n-well 202 is formed in the n-epi 200. In the case of a BiCMOS process an n-buried layer (NBL) 203 may also be formed in the n-epi 200. In the n-epitaxial layer 200, an n+ drain 204 is formed, and an n+ source 206 is formed in a p-well 208 in the n-epi 200. A polysilicon gate 210 is formed on top of the n- and p-wells 202, 208, the extended portion of the gate 210 being isolated from the n-well 202 by an isolation oxide 212. As shown in FIG. 2, the drain 204 includes a drain contact 214, the source includes a source contact 216, and the gate 210 includes a gate contact 220. Unlike the NLDMOS of FIG. 1, this NLDMOS-SCR further includes a p-emitter region 222 formed under the drain contact. This device functions well insofar as it moves the hot spot (shown by region 130) away from the drain contact 214. However, the inclusion of the p-emitter region 222 introduces additional process steps that are typically not required for the devices it supports. Also, the inclusion of the p-emitter region 222 results in a significant saturation NWELL resistor. Thus, the device on-state current is rather low since only the bottom portion of the NWELL under the p-emitter 222 can conduct the current.

The present invention seeks to provide an alternative solution for devices that will not only operate well during normal mode but are also capable of surviving a snapback scenario.

SUMMARY OF THE INVENTION

According to the invention there is provided an NLDMOS, DMOS or NMOS device (both extended and low voltage device) that provides good normal mode operation and is capable of performing a reversible snapback operation, comprising a drain with a plurality of n+ drain pickup contacts, and at least one p+ emitter region, wherein each p+ emitter region is formed between two drain contacts. Each p+ emitter region may include at least one emitter contact that is electrically connected to the n+drain pickup contacts. The device may include multiple p+ emitter regions each with at least one emitter contact, the p+ emitter regions being are formed between the n+ drain pickup contacts. Preferably, the emitter contacts and n+ drain pickup contacts are electrically interconnected by a common metal layer.

In one embodiment, the device comprises an array with multiple drain regions and multiple p+ emitter regions, at least one of the drain regions being provided with multiple drain contacts, and the p+ emitter regions being formed between the drain contacts. All of the drain regions of the array may include multiple drain pickup contacts, and the p+ emitter regions may be interdigitated between the drain pickup contacts of the drain regions. The p+ emitter regions may be interdigitated between each of the drain pickup contacts of each of the drain regions. The p+ emitter regions are typically each provided with at least one emitter contact, the emitter contacts and drain pickup contacts being electrically connected to each other. The emitter contacts and drain pickup contacts may for example be electrically connected to each other by a common metal layer.

Further, according to the invention, there is provided a method of making an NLDMOS, DMOS or NMOS device capable of withstanding snapback mode, comprising providing a first current path between source and drain for normal mode operation, and providing a discharge current path for handling dual injection current. The discharge current path may include a path through one or more p+ emitter regions formed between drain contacts. The p+ emitter regions preferably include emitter contacts electrically connected to the drain contacts. The discharge current path may include a path through multiple p+ emitter regions formed between the drain contacts.

DETAILED DESCRIPTION OF THE INVENTION

Figure 1:
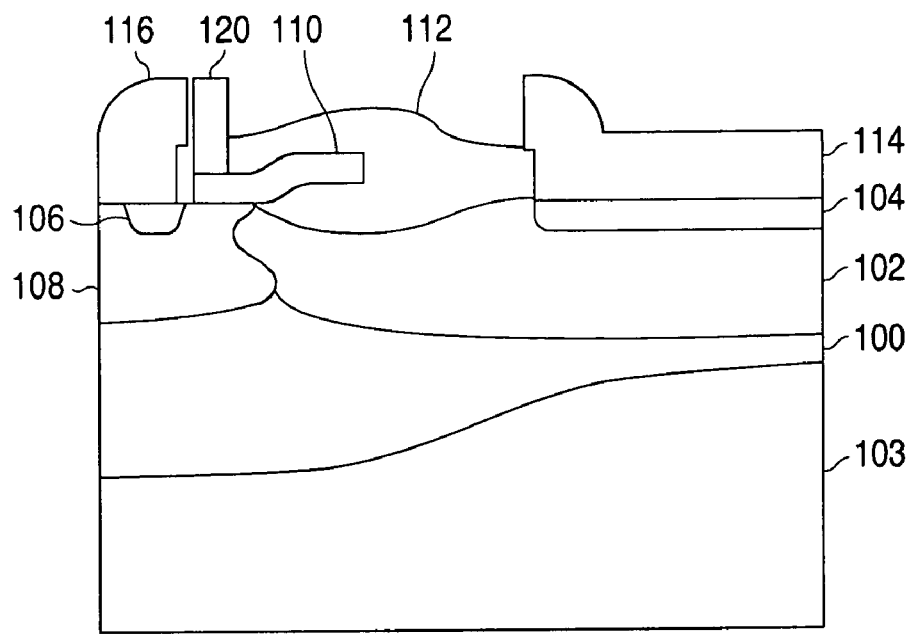
FIG. 1 shows a cross-section through a prior art NLDMOS device.
Figure 2:
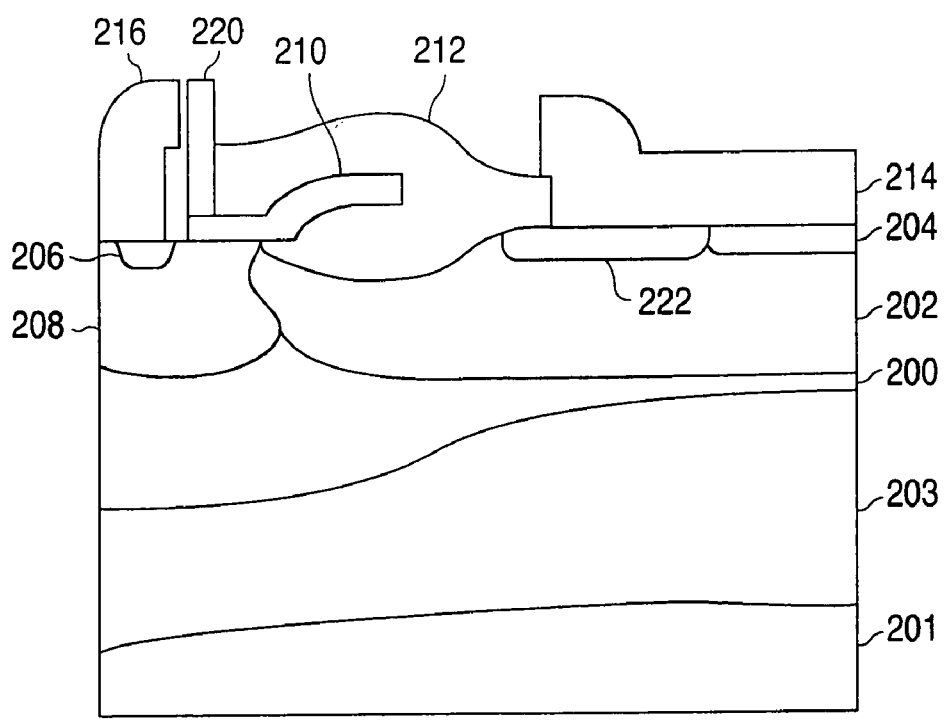
FIG. 2 a cross-section through a prior art NLDMOS-SCR device.
Figure 3:
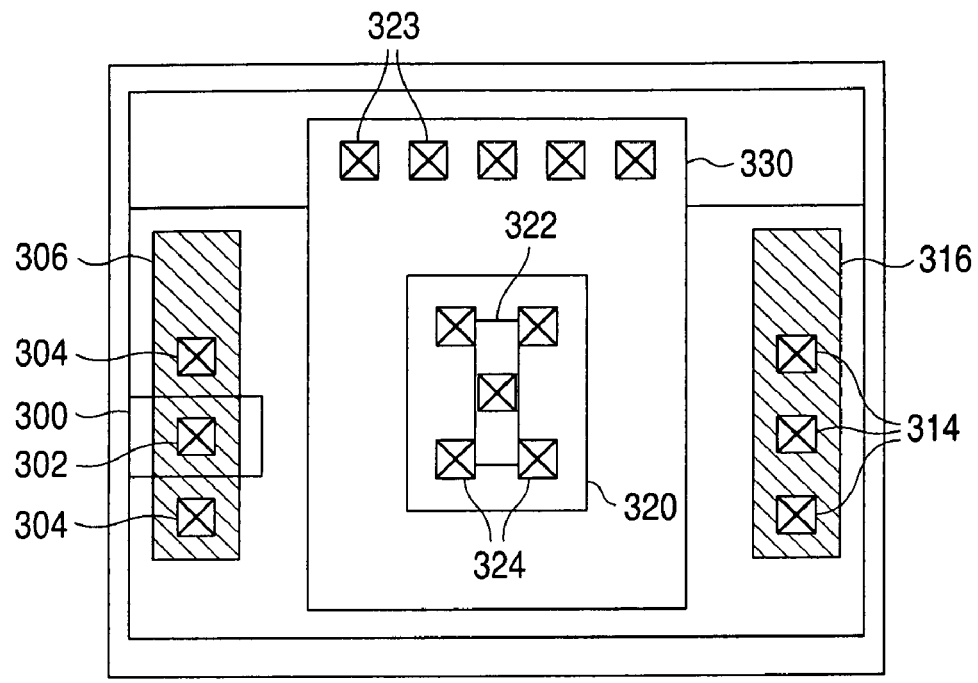
FIG. 3 a top view of one embodiment of an NLDMOS device of the invention.

One embodiment of the invention is show in FIG. 3, which provides for the inclusion of a p+ poly-emitter 300 with contact 302 formed between the drain contacts 304 of n+ drain 306. In this embodiment the other n+ drain 316 with its drain contacts 314, formed on the other side of n+ source 320, does not include any p+ emitter regions. The source 320 includes a bulk 322 and contacts 324. The poly gate 330 with its gate contacts 332 is shown surrounding the source 320.

During normal operation, the current will flow from the source to the drains 306, 316 to be collected by the drain contacts 304, 314. However, under ESD conditions, the emitter region 300 provides the device with SCR characteristics and provides a second current path for dual injection current.

Figure 4:
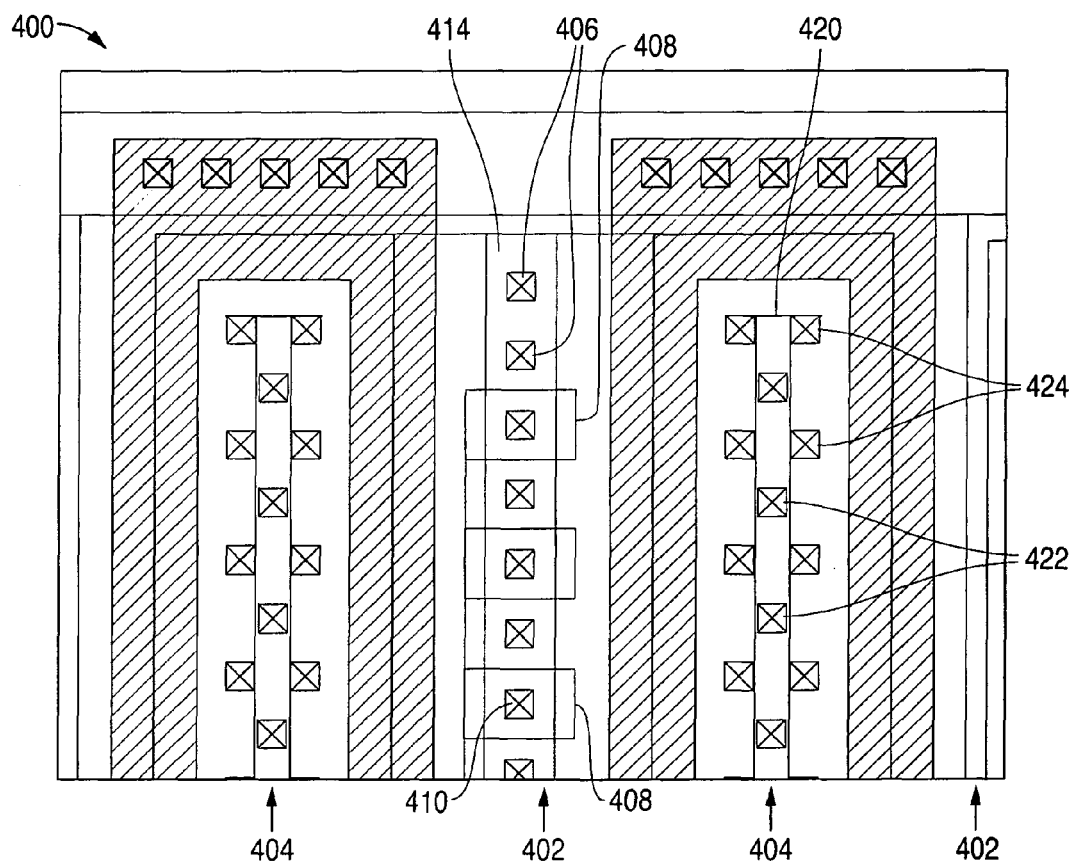
FIG. 4 a top view of another embodiment of an NLDMOS device of the invention.

Another embodiment of the invention is shown in FIG. 4, which shows an array 400 with drain fingers 402 and source fingers 404. The drain fingers include drain contacts 406 with interdigitated p+ emitters 408. The p+ emitters 408 include emitter contacts 410 which are electrically connected to the drain contacts by a common metal layer 414. The rest of the structure includes a bulk 420 with bulk contacts 422 and source contacts 424 for the source fingers 404. The gates 430 with their gate contacts 432 are shown surrounding the source fingers 404. During normal mode, current flows from the source fingers 404 to the drain fingers as shown by the arrows 450. During an ESD event the p+ emitters 408 provide an SCR operation mode. Thus, when the voltage drop due to avalanche drain current opens the p-emitter junction, dual injection current will flow to the p+ emitters 408, the emitters 408 thus providing another current path for the dual injection current and allowing the device to go into reversible snapback mode.

In the case of an array such as the one described above with respect to FIG. 4, the p+ emitters can be included in each of the drain fingers or only in one or some of the fingers.

Figure 5:
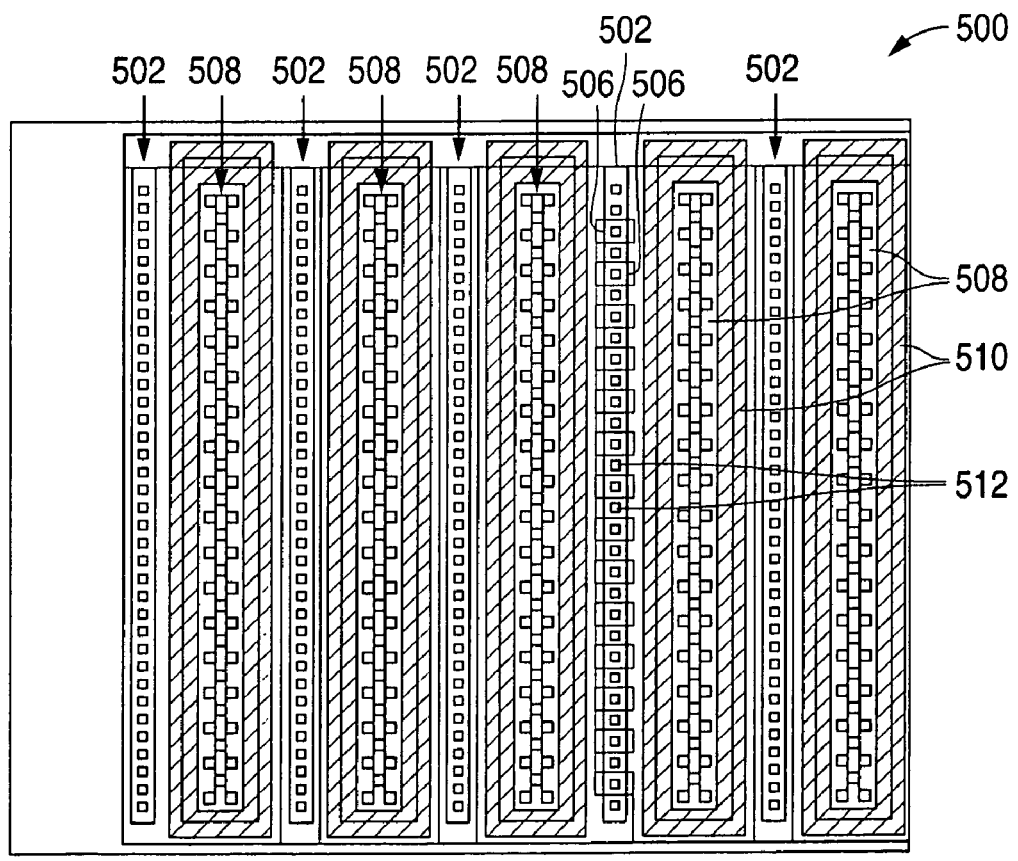
FIG. 5 shows a top view of yet another embodiment of an NLDMOS device of the invention.

FIG. 5 shows an embodiment in which the array 500 has five drain fingers 502 but only drain finger 504 is provided with p+ emitters 506. The rest of the structure is substantially the same as that discussed with respect to FIG. 4 and is therefore not discussed in detail again. For instance, the source fingers 508 are formed between the drain fingers 502 and are surrounded by polygates 510. As shown in FIG. 5, the p+ emitters 506 are interdigitated between the drain contacts 512, although at the top of the matrix two of the drain contacts are shown without an interdigitated p+ emitter. It will be appreciated that other embodiments could be manufactured in which only some or one pair of adjacent drain contacts includes an interdigitated p+ emitter.

Figure 6:
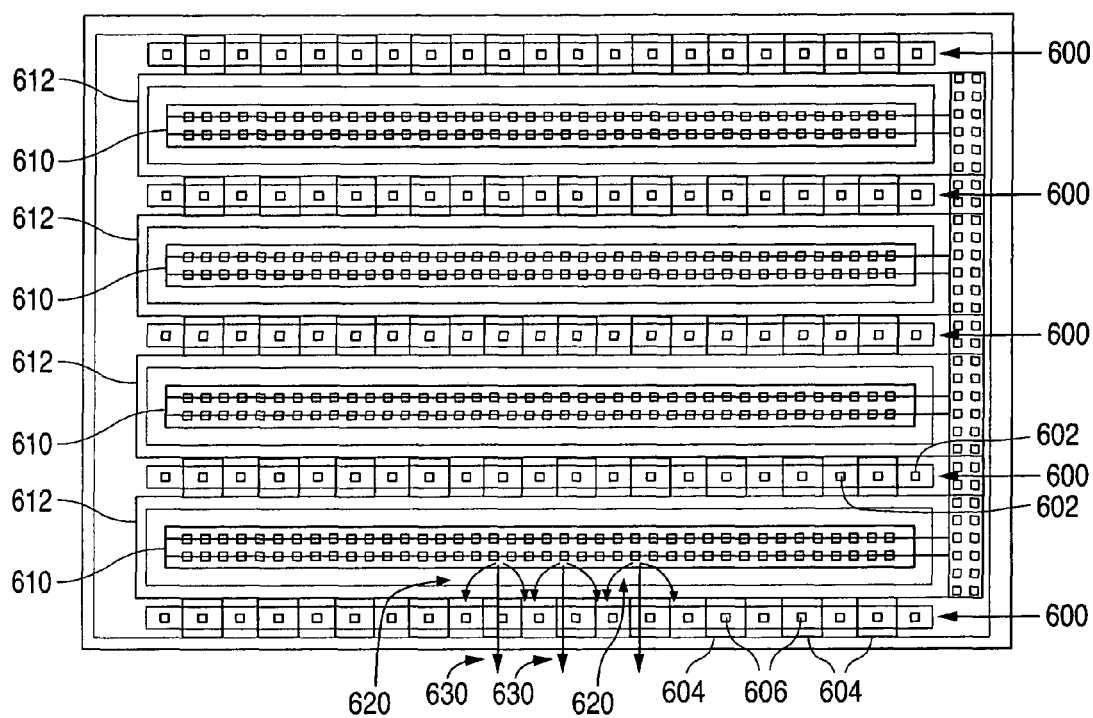
FIG. 6 shows a top view of yet another embodiment of an NLDMOS device of the invention.

Yet another embodiment of the invention is shown in FIG. 6 in which all of the drain fingers 600 include multiple drain contacts 602 and interdigitated p+ emitters 604 with contacts 606. The source fingers 610 are formed between the drain fingers 600 and are surrounded by polygates 612. During normal mode, current flow between source and drain is as shown by arrows 620, while during snapback mode, the dual injection current makes use of the second current path provided by the p+ emitters 604, as shown by the arrows 630.

In each of the embodiments, the contacts to the p+ emitters are electrically connected to the drain contacts, e.g., by connecting them using a common metal layer.

The present invention is applicable in very large high voltage devices e.g. 50 V devices where the device can be entirely self protecting, and is also applicable in smaller devices such as 24 V devices where it may function as a second stage together with a local ESD clamp.

While the invention has been described with respect to a few exemplary embodiments, it will be appreciated that these were included by way of illustration only and are not intended to limit the scope of the invention as defined by the claims.

What is claimed is:

1. An NLDMOS, DMOS or NMOS device that provides good normal mode operation and is capable of performing a reversible snapback operation, comprising
   a source,
   a gate,
   a drain with a plurality of n+ drain pickup contacts spaced along the width of the drain, and
   at least one p+ emitter region, wherein the p+ emitter regions are formed substantially in line, along the width of the drain, and each p+ emitter region includes an emitter contact, the emitter contacts being arranged substantially in line with the n+ drain pickup contacts.

2. A device of claim 1, wherein each p+ emitter region includes at least one emitter contact that is electrically connected to the n+ drain pickup contacts.

3. A device of claim 2, wherein the device includes multiple p+ emitter regions each with at least one emitter contact.

4. A device of claim 3, wherein the emitter contacts and n+ drain pickup contacts are electrically interconnected by a common metal layer.

5. A device of claim 1, wherein the device comprises an array with multiple drain fingers and multiple p+ emitter regions, at least one of the drain fingers being provided with multiple drain pickup contacts, and the p+ emitter regions being formed between the drain pickup contacts along the width of the drain finger so that a single p+ emitter region is formed between any two adjacent drain pickup contacts.

6. A device of claim 5, wherein all of the drain fingers of the array include multiple drain pickup contacts, and the p+ emitter regions are interdigitated between the drain pickup contacts of at least one of the drain fingers along the width of the at least one drain finger.

7. A device of claim 6, wherein the p+ emitter regions are interdigitated between each of the drain pickup contacts of each of the drain fingers.

8. A device of claim 5, wherein the p+ emitter regions are each provided with at least one emitter contact, the emitter contacts and drain pickup contacts being electrically connected to each other.

9. A device of claim 8, wherein the emitter contacts and drain pickup contacts are electrically connected to each other by a common metal layer.

* * * * *